US009760017B2

United States Patent
Shiozawa et al.

(10) Patent No.: US 9,760,017 B2
(45) Date of Patent: Sep. 12, 2017

(54) WAFER LITHOGRAPHY EQUIPMENT

(71) Applicant: Toshiba Memory Corporation, Minato-ku (JP)

(72) Inventors: Kazufumi Shiozawa, Yokohama (JP); Toshihide Kawachi, Yokkaichi (JP); Masamichi Kishimoto, Yokkaichi (JP); Nobuhiro Komine, Nagoya (JP); Yoshimitsu Kato, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 43 days.

(21) Appl. No.: 14/803,209

(22) Filed: Jul. 20, 2015

(65) Prior Publication Data

US 2016/0274470 A1    Sep. 22, 2016

Related U.S. Application Data

(60) Provisional application No. 62/135,996, filed on Mar. 20, 2015.

(51) Int. Cl.
*G03F 7/20* (2006.01)
*G03F 9/00* (2006.01)
*H01L 21/66* (2006.01)

(52) U.S. Cl.
CPC .......... *G03F 7/70491* (2013.01); *G03F 7/705* (2013.01); *G03F 7/70483* (2013.01);
(Continued)

(58) Field of Classification Search
CPC ............. G03F 7/70516; G03F 7/70425; G03F 7/70433; G03F 7/70441; G03F 7/70483;
(Continued)

(56) References Cited

U.S. PATENT DOCUMENTS 7,250,235 B2    7/2007  Izuha et al.
2007/0050749 A1*  3/2007  Ye .............................. G03F 1/44
                                                              430/30
2013/0088696 A1    4/2013  Miyazaki et al.

FOREIGN PATENT DOCUMENTS

JP    2001-351853    12/2001
JP    2007-173435    7/2007
(Continued)

*Primary Examiner* — Michelle M Iacoletti
(74) *Attorney, Agent, or Firm* — Oblon, McClelland, Maier & Neustadt, L.L.P.

(57) ABSTRACT

According to one embodiment, wafer lithography equipment includes an exposure unit transferring a circuit pattern onto a wafer, a measurement unit measuring a dimension of the circuit pattern and a calculator. The calculator includes calculating a first difference. The first difference is the difference between a first dimension and a second dimension. The first dimension is obtained by substituting a first exposure amount and a first focus distance into an approximate response surface function. The second dimension is measured by the measurement unit. The calculator also includes calculating a second difference. The second difference is the sum total of the first difference for all of the circuit patterns. The calculator also includes calculating a second exposure amount and a second focus distance causing the difference between the approximate response surface function and the second difference to be a minimum. The calculator also includes calculating a correction exposure amount.

9 Claims, 12 Drawing Sheets

(52) U.S. Cl.
CPC ...... *G03F 7/70558* (2013.01); *G03F 7/70616* (2013.01); *G03F 7/70625* (2013.01); *G03F 7/70641* (2013.01); *G03F 7/70683* (2013.01); *G03F 9/7026* (2013.01); *H01L 22/20* (2013.01)

(58) Field of Classification Search
CPC .. G03F 7/70491; G03F 7/705; G03F 7/70508; G03F 7/70525; G03F 7/7055; G03F 7/70558; G03F 7/70625; G03F 7/70616; G03F 7/70641; G03F 9/7026; G03F 7/70683
See application file for complete search history.

(56) References Cited

FOREIGN PATENT DOCUMENTS

| | | |
|---|---|---|
| JP | 2008-112889 | 5/2008 |
| JP | 2009-104024 | 5/2009 |
| JP | 2011-40433 | 2/2011 |

\* cited by examiner

| REGION E | EXPOSURE AMOUNT U | FOCUS DISTANCE V | DIMENSION DA |
|---|---|---|---|
| $E_1$ | $U_1$ | $V_1$ | $DA_1$ |
| $E_2$ | $U_2$ | $V_2$ | $DA_2$ |
| $E_3$ | $U_3$ | $V_3$ | $DA_3$ |
| . . . | . . . | . . . | . . . |
| $E_j$ | $U_j$ | $V_j$ | $DA_j$ |
| . . . | . . . | . . . | . . . |
| $E_x$ | $U_x$ | $V_x$ | $DA_x$ |

FIG. 7

EXPOSURE AMOUNT

EXPOSURE AMOUNT

EXPOSURE AMOUNT

WAFER LITHOGRAPHY EQUIPMENT

CROSS-REFERENCE TO RELATED APPLICATIONS

This application is based upon and claims the benefit of priority from U.S. Provisional Patent Application 62/135,996, filed on Mar. 20, 2015; the entire contents of which are incorporated herein by reference.

FIELD

Embodiments described herein relate generally to a wafer lithography equipment.

BACKGROUND

Conventionally, downscaling of a circuit pattern is performed for higher integration of a semiconductor device. In the manufacture of the semiconductor device including such a downscaled circuit pattern, it is desirable to manufacture the product and increase the yield by setting an exposure amount, a focus distance, etc., in the exposure unit of the lithography equipment that are optimal for the circuit pattern.

BRIEF DESCRIPTION OF THE DRAWINGS

FIG. 7 is a figure showing the measurement results of the dimension DA;

DETAILED DESCRIPTION

Figure 1:
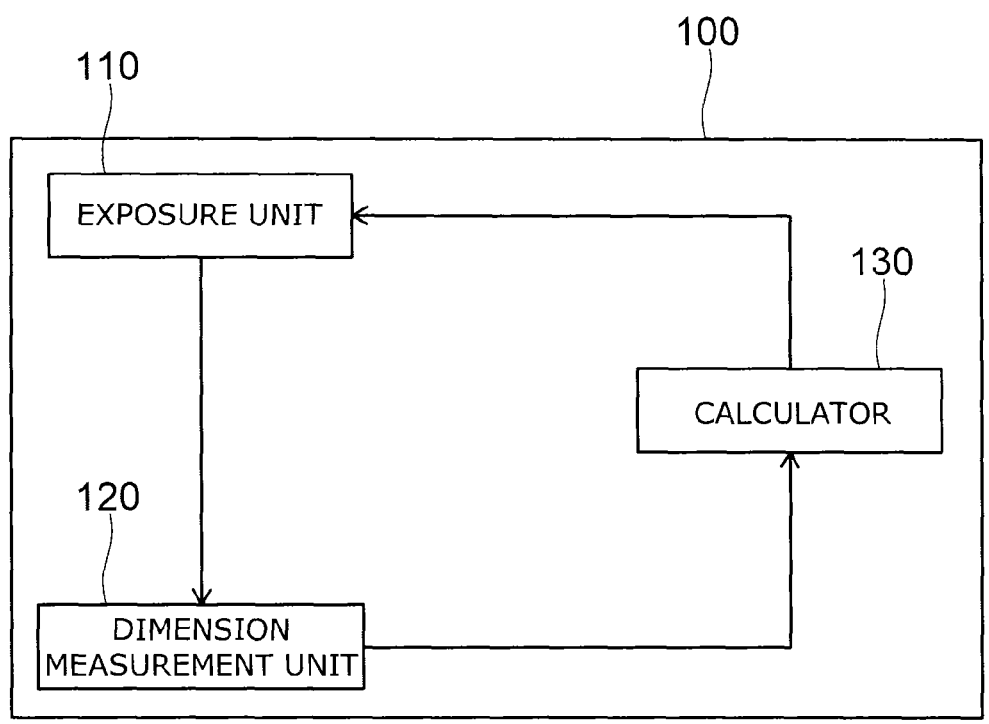
FIG. 1 is a block diagram showing the lithography equipment according to the embodiment.

According to one embodiment, wafer lithography equipment includes an exposure unit transferring a circuit pattern onto a wafer, a measurement unit measuring a dimension of the circuit pattern and a calculator. The calculator includes calculating a first difference. The first difference is the difference between a first dimension and a second dimension. The first dimension is obtained by substituting a first exposure amount and a first focus distance into an approximate response surface function. The second dimension is measured by the measurement unit. The calculator also includes calculating a second difference. The second difference is the sum total of the first difference for all of the circuit patterns. The calculator also includes calculating a second exposure amount and a second focus distance causing the difference between the approximate response surface function and the second difference to be a minimum. The calculator also includes calculating a correction exposure amount. The correction exposure amount is the difference between the first exposure amount and the second exposure amount. The calculator also includes calculating a correction focus distance. The correction focus distance is the difference between the first focus distance and the second focus distance. The calculator also includes calculating a third exposure amount by adding the correction exposure amount to the first exposure amount. The calculator also includes calculating a third focus distance by adding the correction focus distance to the first focus distance.

According to one embodiment, a method for manufacturing a semiconductor device includes transferring a circuit pattern onto a wafer, measuring a dimension of the circuit pattern. The method for manufacturing a semiconductor device also includes calculating a first dimension by substituting a first exposure amount and a first focus distance into an approximate response surface function. The method for manufacturing a semiconductor device also includes calculating a first difference. The first difference is the difference between the first dimension and a second dimension. The second dimension is the measured dimension. The method for manufacturing a semiconductor device also includes calculating a second difference. The second difference is the sum total of the first difference for all of the circuit patterns. The method for manufacturing a semiconductor device also includes calculating a second exposure amount and a second focus distance causing the difference between the approximate response surface function and the second difference to be a minimum. The method for manufacturing a semiconductor device also includes calculating a correction exposure amount. The correction exposure amount is the difference between the first exposure amount and the second exposure amount. The method for manufacturing a semiconductor device also includes calculating a correction focus distance. The correction focus distance is the difference between the first focus distance and the second focus distance. The method for manufacturing a semiconductor device also includes calculating a third exposure amount by adding the correction exposure amount to the first exposure amount. The method for manufacturing a semiconductor device also includes calculating a third focus distance by adding the correction focus distance to the first focus distance.

An embodiment of the invention will now be described with reference to the drawings.

The configuration of the lithography equipment according to the embodiment will now be described.

FIG. 1 is a block diagram showing the lithography equipment according to the embodiment.

As shown in FIG. 1, the lithography equipment 100 according to the embodiment includes an exposure unit 110 that transfers a circuit pattern onto a wafer, a dimension measurement unit 120 for measuring a dimension of the circuit pattern, and a calculator 130. The calculator 130 performs calculation processing of calculating, from the dimension measured by the dimension measurement unit 120, an exposure amount U(N) and a focus distance V(N) to be set in the exposure unit 110. An optimal exposure amount and focus distance are set each time a wafer is made. The exposure amount and the focus distance are variables of the number N of wafers made.

The exposure unit 110 will now be described.

Figure 2:
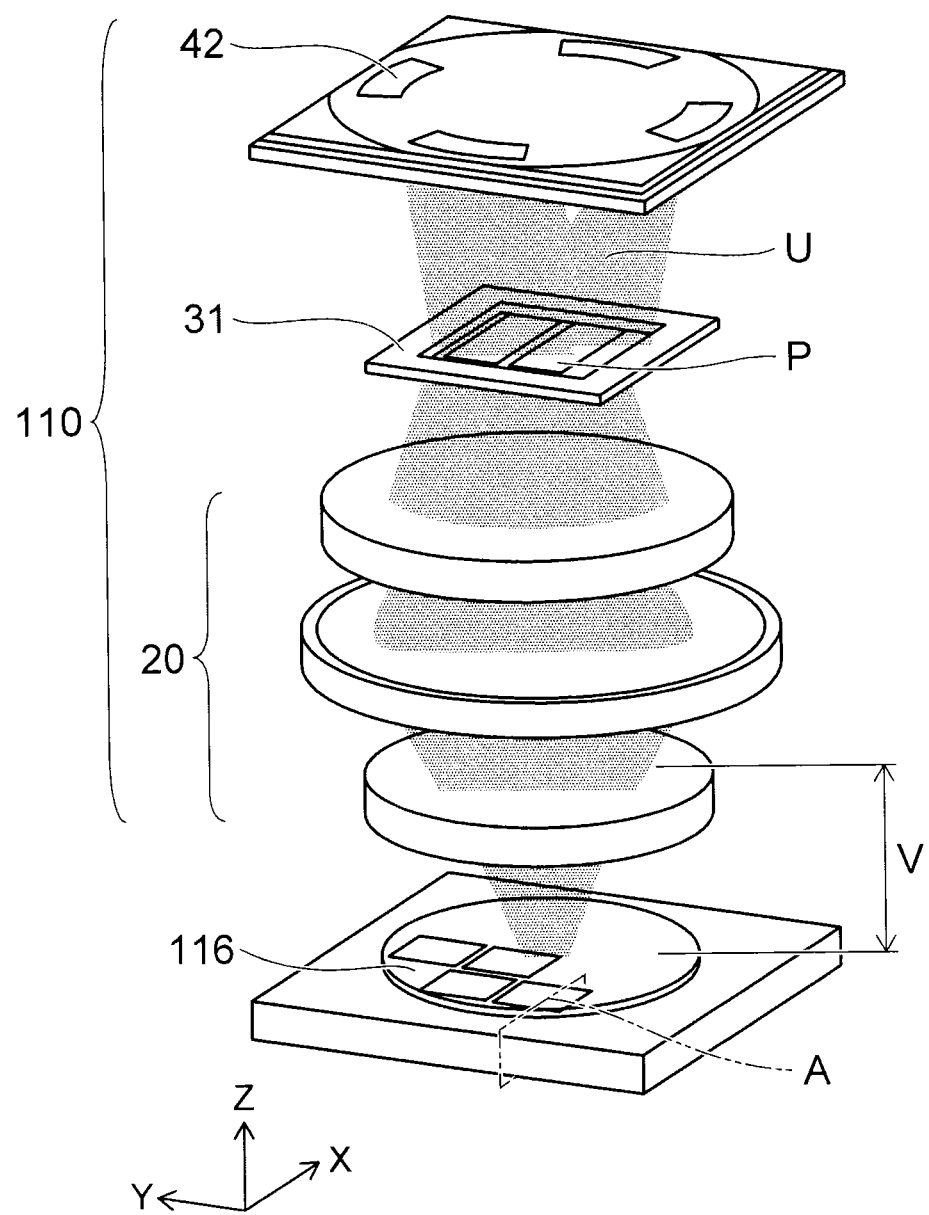
FIG. 2 is a schematic view of the exposure unit shown in FIG. 1.

FIG. 2 is a schematic view of the exposure unit shown in FIG. 1.

As shown in FIG. 2, the exposure unit 110 includes illumination 42, a mask 31, and a lens unit 20 that includes multiple lenses. The relationship of these is no different from that of normal lithography equipment. A circuit pattern P for transferring onto a wafer 116 is included in the mask 31.

Hereinbelow, an XYZ orthogonal coordinate system is employed in the specification for convenience of description. Namely, two directions parallel to the upper surface of the wafer 116 and orthogonal to each other are taken as an "X-direction" and a "Y-direction." A direction in which the lens unit 20 is mounted that is perpendicular to the upper surface of the wafer 116 is taken as a "Z-direction."

When transferring the circuit pattern P onto the wafer 116, the wafer 116 is moved so that the transfer destination of the circuit pattern P is at a prescribed region of the wafer 116; a focus distance V and an exposure amount U are set; and the exposure is performed. Thereby, the circuit pattern P that is included in the mask 31 is transferred onto the wafer 116. The focus distance V is the distance between the lens unit 20 and the wafer 116.

After one circuit pattern P is transferred onto the wafer 116, in the case where the circuit pattern P is to be transferred further, the wafer 116 is moved once more so that the transfer destination of the circuit pattern P is at a prescribed region of the wafer 116; and the exposure is performed. By repeatedly performing these operations, the circuit pattern P is transferred onto substantially the entire surface of the wafer 116.

Figure 3A:
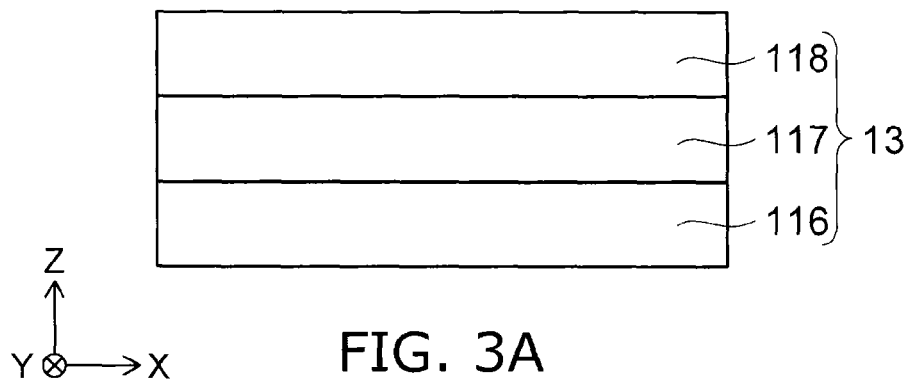
FIG. 3A is a cross-sectional view showing portion A of the circuit pattern P shown in FIG. 2 prior to transferring.

FIG. 3A is a cross-sectional view showing portion A of the circuit pattern P shown in FIG. 2 prior to transferring.

As shown in FIG. 3A, an anti-reflection film 117 is provided on the wafer 116; and a resist film 118 that is photosensitive is provided on the anti-reflection film 117.

Figure 3B:
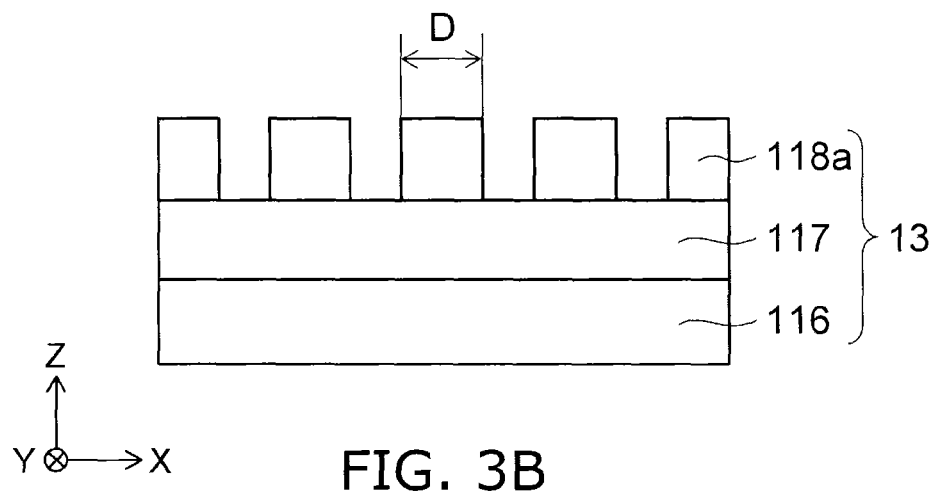
FIG. 3B is a cross-sectional view showing portion A of the circuit pattern P shown in FIG. 2 after transferring.

FIG. 3B is a cross-sectional view showing portion A of the circuit pattern P shown in FIG. 2 after transferring.

As shown in FIG. 3B, by developing after the exposure, the portions of the resist film 118 where the light is irradiated are removed; and the portions of the resist film 118 where the light is not irradiated remain without being removed. Thus, the circuit pattern P is transferred onto the resist film 118. The resist film 118 after the circuit pattern P is transferred is called a resist pattern 118a. The width of the resist pattern 118a is called a dimension D.

The dimension D changes due to mainly six components, i.e., the configuration of the illumination 42, the configuration of the circuit pattern P, the aberration unique to the lens, the focus distance V, the exposure amount U, and the configuration of a resist stacked body 13. The aberration of the lens refers to the coloring, blurring, and distortion that occur when converting the subject to the image; but ideally, the aberration is not converted geometrically. The configuration of the resist stacked body 13 refers to the refractive indexes, light extinction coefficients, and film thicknesses of the films of the wafer 116, the anti-reflection film 117, and the resist film 118; and the dimension D changes due to the change of the configuration.

Among the six major components determining the dimension D, there are many cases where the configuration of the illumination 42 and the aberration unique to the lens have values unique to each lithography equipment. There are many cases where the configuration of the circuit pattern P and the configuration of the resist film have values unique to each product and each process. Accordingly, the focus distance V and the exposure amount U are major components that change each lot.

The operations of the lithography equipment according to the embodiment will now be described.

Figure 4:
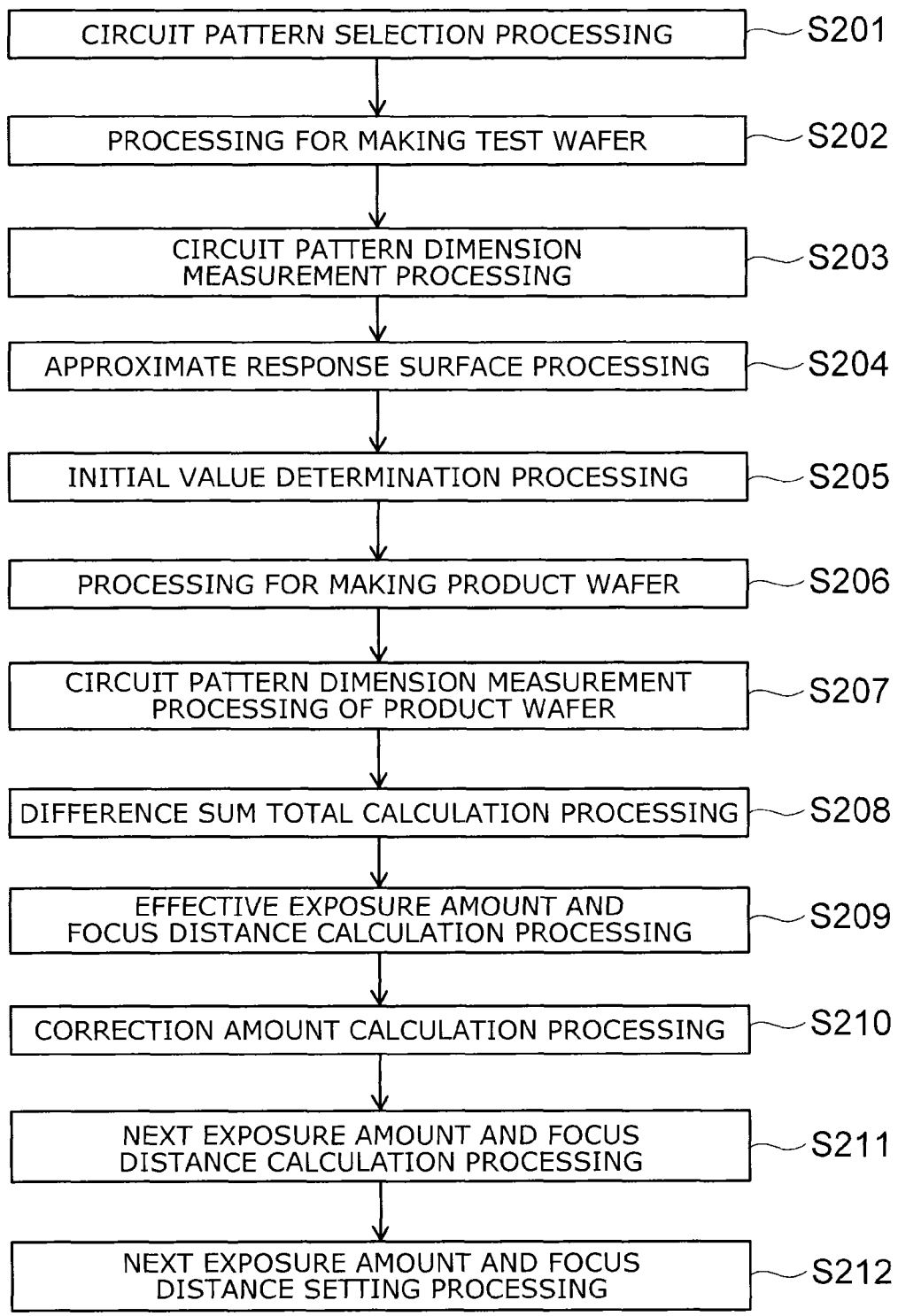
FIG. 4 is a flowchart showing the operations of the lithography equipment according to the embodiment.

FIG. 4 is a flowchart showing the operations of the lithography equipment according to the embodiment.

Figure 5A:
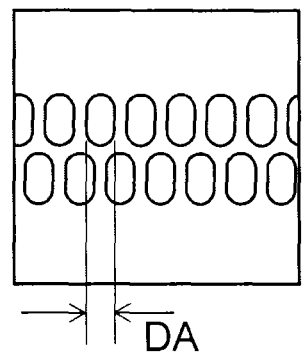
FIG. 5A is a plan view showing a circuit pattern A.

FIG. 5A is a plan view showing a circuit pattern A.

Figure 5B:
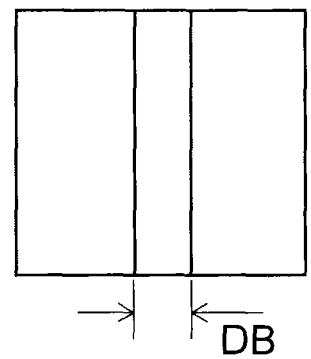
FIG. 5B is a plan view showing a circuit pattern B.

FIG. 5B is a plan view showing a circuit pattern B.

Figure 5C:
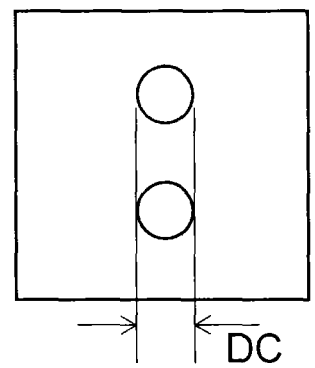
FIG. 5C is a plan view showing a circuit pattern C.

FIG. 5C is a plan view showing a circuit pattern C.

First, as shown in step S201 of FIG. 4, a circuit pattern is selected. Specifically, three or more different circuit patterns are selected from inside the circuit layout. For example, the selection of the circuit pattern is performed by selecting from the circuit patterns that are more numerous inside the circuit layout.

Hereinbelow, the case where the number of circuit patterns is three will be described up to step S207 shown in FIG. 4 to simplify the description. The three patterns are, for example, the circuit pattern A shown in FIG. 5A, the circuit pattern B shown in FIG. 5B, and the circuit pattern C shown in FIG. 5C. The circuit pattern A includes multiple ellipses; and the minor diameter of the ellipses is used as a dimension DA. The circuit pattern B is a line; and the line width is used as a dimension DB. The circuit pattern C includes two circles; and the diameter of the circles is used as a dimension DC.

Then, as shown in step S202 of FIG. 4, a test wafer 114 is made. The method for making the test wafer 114 is shown in (i-1) to (i-4) recited below.

Figure 6:
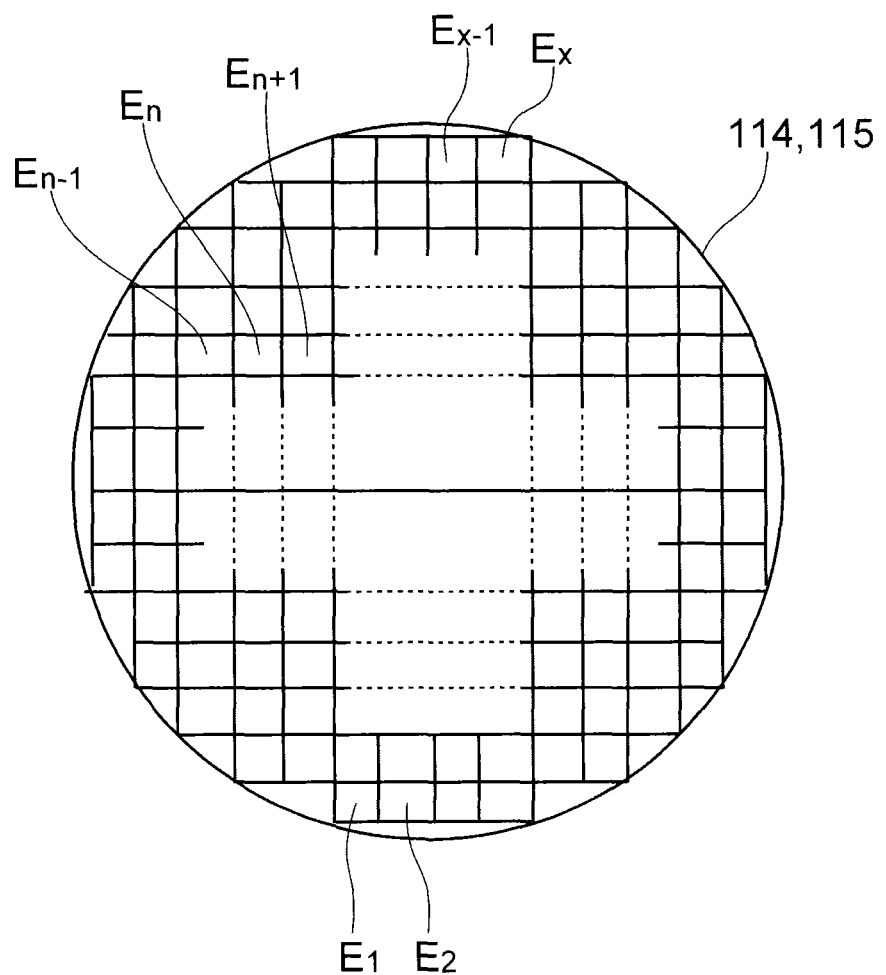
FIG. 6 is a plan view showing wafers.

FIG. 6 is a plan view showing wafers.

(i-1) A first transfer is performed by the exposure unit 110 being operated so that the circuit pattern A is transferred from the mask 31 onto a region $E_1$ of the test wafer 114 shown in FIG. 6. The exposure amount U at this time is taken as $U_1$; and the focus distance V at this time is taken as $V_1$.

(i-2) A second transfer is performed by the exposure unit 110 operating so that the circuit pattern A is transferred from the mask 31 onto a region $E_2$ of the test wafer 114. The exposure amount U at this time is taken as $U_2$; and the focus distance V at this time is taken as $V_2$. At least one of the exposure amount $U_1$ or the focus distance $V_1$ of (i-1) recited above is modified when used as the exposure amount $U_2$ and the focus distance $V_2$.

(i-3) At least one of the (n−1)th exposure amount $U_{n-1}$ or focus distance $V_{n-1}$ is modified when used as the nth exposure amount $U_n$ and focus distance $V_n$. The nth transfer is performed by the exposure unit 110 operating so that the circuit pattern A is transferred from the mask 31 onto a region $E_n$ of the test wafer 114. n is a natural number not less than 3.

(i-4) The transfer shown in (i-3) recited above is repeated until the xth transfer which is the end repetition number is performed. x is a natural number greater than n.

Similarly to (i-1) to (i-4) recited above, the test wafers 114 are made for the circuit pattern B and for the circuit pattern C.

Then, as shown in step S203 of FIG. 4, the measurement of the dimension of the circuit pattern of the test wafer 114 is performed. For example, the measurements of the dimension DA, the dimension DB, and the dimension DC are performed using a SEM (Scanning Electron Microscope).

FIG. 7 is a figure showing the measurement results of the dimension DA.

The first column shows the region $E_1$ to a region $E_x$ of the test wafer 114 shown in FIG. 6. The second column shows the exposure amounts $U_1$ to $U_x$ set in the exposure unit 110 for the region $E_1$ to the region $E_x$. The exposure amount that is set in the exposure unit 110 for a region $E_j$ is taken as $U_j$. j is a natural number. The third column is the focus distances $V_1$ to $V_x$ set in the exposure unit 110 in the region $E_1$ to the region $E_x$. The focus distance that is set in the exposure unit 110 in the region $E_j$ is taken as $V_j$. The fourth column shows dimensions $DA_1$ to $DA_x$ measured by the dimension measurement unit 120 shown in FIG. 1. The dimension measured in the region $E_j$ is taken as $DA_j$. Similarly, the dimension DB of the circuit pattern B and the dimension DC of the circuit pattern C are measured.

Then, as shown in step S204 of FIG. 4, the approximate response surface function is determined. The exposure amount $U_j$, the focus distance $V_j$, and the dimension $DA_j$ shown in FIG. 7 are discrete values. For example, a continuous approximate response surface function that has the exposure amount U and the focus distance V as variables is determined from these discrete values by utilizing the least-squares method. The dimensions DB and DC are determined similarly.

Figure 8A:
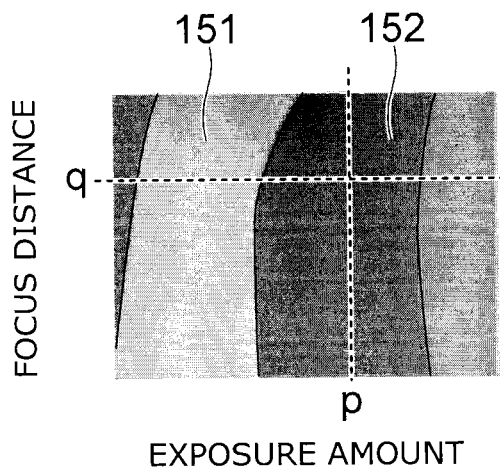
FIG. 8A is a graph showing the approximate response surface function of the dimension DA, where the horizontal axis is the exposure amount, and the vertical axis is the focus distance.

FIG. 8A is a graph showing the approximate response surface function of the dimension DA, where the horizontal axis is the exposure amount, and the vertical axis is the focus distance.

Figure 8B:
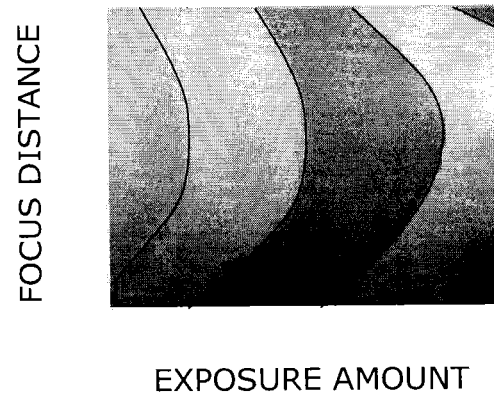
FIG. 8B is a graph showing the approximate response surface function of the dimension DB, where the horizontal axis is the exposure amount, and the vertical axis is the focus distance.

FIG. 8B is a graph showing the approximate response surface function of the dimension DB, where the horizontal axis is the exposure amount, and the vertical axis is the focus distance.

Figure 8C:
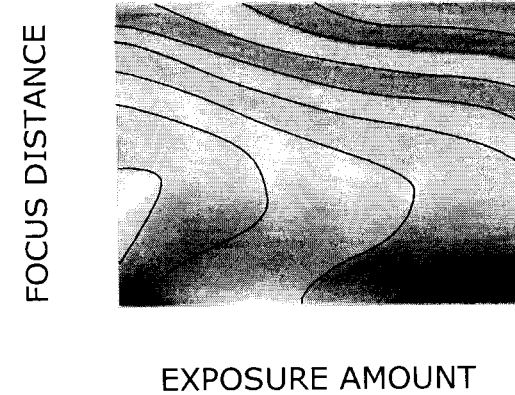
FIG. 8C is a graph showing the approximate response surface function of the dimension DC, where the horizontal axis is the exposure amount, and the vertical axis is the focus distance.

FIG. 8C is a graph showing the approximate response surface function of the dimension DC, where the horizontal axis is the exposure amount, and the vertical axis is the focus distance.

The approximate response surface function of the dimension DA is a function having the exposure amount U and the focus distance V as variables. Accordingly, for example, the approximate response surface function of the dimension DA is expressed by Formula 1 recited below.

$$f_A(U,V) \qquad \text{[Formula 1]}$$

Similarly, the approximate response surface function of the dimension DB is expressed by Formula 2 recited below.

$$f_B(U,V) \qquad \text{[Formula 2]}$$

Similarly, the approximate response surface function of the dimension DC is expressed by Formula 3 recited below.

$$f_C(U,V) \qquad \text{[Formula 3]}$$

For example, a region 151 shown in FIG. 8A illustrates the dimension DA in the range from $DA_{k1}$ to $DA_{k2}$; and, for example, a region 152 illustrates the dimension DA in the range from $DA_{k2}$ to $DA_{k3}$.

As shown in FIG. 8A, FIG. 8B, and FIG. 8C, the approximate response surface function of the dimension D having the exposure amount U and the focus distance V as variables is different between the circuit patterns. For example, the dimension DA of the circuit pattern A (referring to FIG. 8A) does not fluctuate much even when the focus distance V changes. The change amount with respect to the focus distance V of the dimension DC of the circuit pattern C (referring to FIG. 8C) is larger than the change amount of the dimension DA.

Then, as shown in step S205 of FIG. 4, the initial exposure amount U(0) and the initial focus distance V(0) of a product wafer 115 are determined.

The determination of the initial exposure amount U(0) will now be described.

Figure 9A:
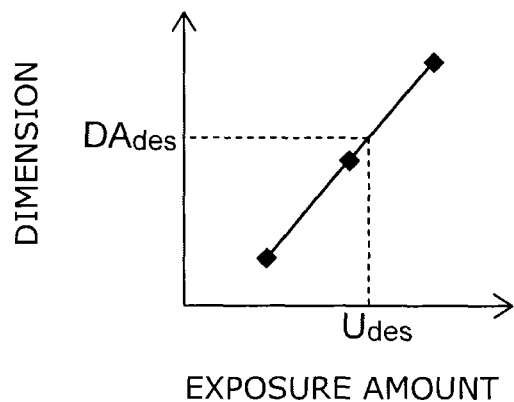
FIG. 9A is a graph showing the effects of the exposure amount U on the dimension DA, where the horizontal axis is the exposure amount U, and the vertical axis is the dimension DA.

FIG. 9A is a graph showing the effects of the exposure amount U on the dimension DA, where the horizontal axis is the exposure amount U, and the vertical axis is the dimension DA.

FIG. 9A shows the relationship of the exposure amount U and the dimension DA for the approximate response surface function shown in FIG. 8A in the case where the focus distance V is a constant value q.

Figure 9B:
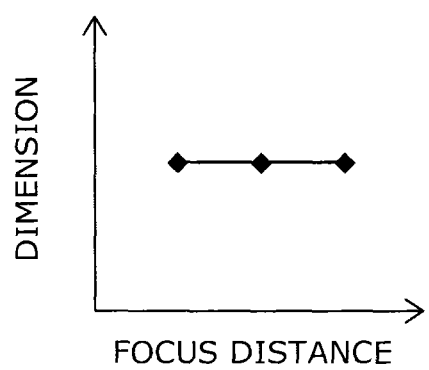
FIG. 9B is a graph showing the effects of the focus distance V on the dimension DA, where the horizontal axis is the focus distance, and the vertical axis is the dimension DA.

FIG. 9B is a graph showing the effects of the focus distance V on the dimension DA, where the horizontal axis is the focus distance, and the vertical axis is the dimension DA.

FIG. 9B shows the relationship of the focus distance V and the dimension DA for the approximate response surface function shown in FIG. 8A in the case where the exposure amount U is a constant value p.

As shown in FIG. 9A, for the circuit pattern A, the dimension DA increases as the exposure amount U increases. The exposure amount U and the dimension DA have a substantially proportional relationship.

As shown in FIG. 9B, for the circuit pattern A, the dimension DA substantially does not change, even when the focus distance V changes. There are cases where a desired dimension $DA_{des}$ is not obtained, even when the focus distance V is modified. Accordingly, the desired dimension $DA_{des}$ is obtained by modifying the exposure amount. The exposure amount is determined from the desired dimension $DA_{des}$ and the graph of FIG. 9A. For example, in the graph of FIG. 9A, $U_{des}$ is obtained as the exposure amount corresponding to the dimension $DA_{des}$. Then, the exposure amount $U_{des}$ is determined to be the initial exposure amount U(0).

The determination of the initial focus distance V(0) will now be described.

Figure 10:
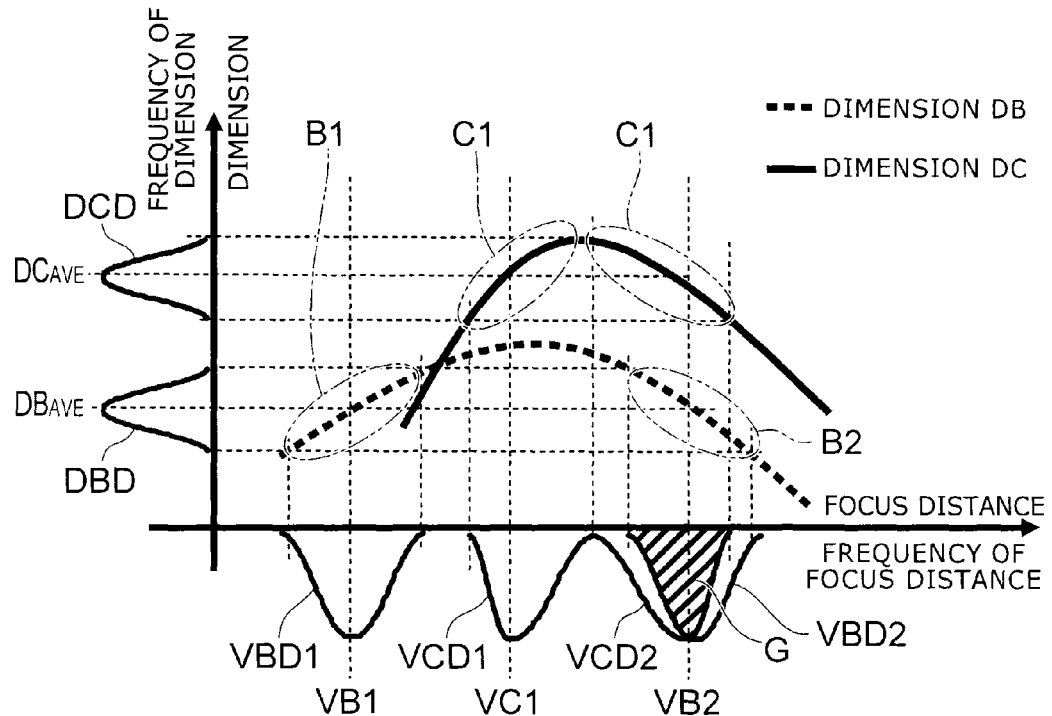
FIG. 10 is a graph showing the effects of the focus distance V on the dimension DB and the dimension DC, where the horizontal axis is the focus distance V, and the vertical axis is the dimensions DB and DC.

FIG. 10 is a graph showing the effects of the focus distance V on the dimension DB and the dimension DC, where the horizontal axis is the focus distance V, and the vertical axis is the dimensions DB and DC.

The dimension DB shown in FIG. 10 is the relationship of the focus distance V and the dimension DB for the approximate response surface function of the dimension DB shown in FIG. 8B in the case where the exposure amount U is used as the initial exposure amount U(0).

The dimension DC shown in FIG. 10 is the relationship of the focus distance V and the dimension DC for the approximate response surface function of the dimension DC shown in FIG. 8C in the case where the exposure amount U is used as the initial exposure amount U(0).

The negative side of the vertical axis of FIG. 10 shows the frequencies of the dimension DB and the dimension DC measured in step S203. DBD illustrates the frequency of the dimension DB; and DCD illustrates the frequency of the dimension DC. $DB_{AVE}$ is the average value of the dimension DB; and $DC_{AVE}$ is the average value of the dimension DC.

The negative side of the horizontal axis of FIG. 10 shows the frequency of the focus distance V for the frequencies of the dimension DB and the dimension DC. VBD1 is the frequency determined from DBD and region B1 of the approximate response surface function of the dimension DB. VBD2 is the frequency determined from DBD and region B2 of the approximate response surface function of the dimension DB. VB1 and VB2 are the values of the focus distance V when the dimension DB is $DB_{AVE}$. VCD1 is the frequency determined from DCD and region C1 of the approximate response surface function of the dimension DC. VCD2 is the frequency determined from DCD and region C2 of the approximate response surface function of the dimension DC. VC1 is the value of the focus distance V when the dimension DC is $DC_{AVE}$.

As shown in FIG. 10, the frequency of the focus distance V for the frequency DBD includes the frequencies VBD1 and VBD2. The frequency of the focus distance V for the frequency DCD includes the frequencies VCD1 and VCD. An overlapping region G is included in the frequency VBD2 and the frequency VCD2.

If the focus distance V is set to VB2 inside the overlapping region G, not only the dimension DB but also the dimension DC can be accommodated. Accordingly, the focus distance V is set to VB2 shown in FIG. 10; and this is used as the initial focus distance V(0).

Then, as shown in step S206 of FIG. 4, the product wafer 115 is made.

The method for making the product wafer 115 is shown in (ii-1) to (ii-4) recited below.

(ii-1) The exposure amount U of the exposure unit 110 is used as the initial exposure amount U(0); and the focus distance V is used as the initial focus distance V(0).

(ii-2) The circuit pattern P is transferred from the mask 31 onto the region $E_1$ of the product wafer 115 shown in FIG. 6. The circuit pattern P includes the circuit pattern A, B, or C.

(ii-3) The circuit pattern P is transferred from the mask 31 onto the region $E_2$ of the product wafer 115.

(ii-4) (ii-3) recited above is repeated until the circuit pattern P is transferred onto the region $E_x$ which is the final transfer destination of the product wafer 115.

Then, as shown in step S207 of FIG. 4, the measurements of the dimension DA of the circuit pattern A, the dimension DB of the circuit pattern B, and the dimension DC of the circuit pattern C for the product wafer 115 are performed.

When manufacturing the product wafer 115 of step S206, for example, there are cases where dirt adheres to the bottom of the product wafer 115, and the focus distance V shifts. Also, there are cases where the exposure amount U changes due to heat, etc. There are cases where the dimension DA, the dimension DB, and the dimension DC that are measured change each time the product wafer 115 is made.

To accommodate such changes of the exposure amount U and the focus distance V, the exposure amount U and the focus distance V are optimized and set based on the approximate response surface function each time the product wafer 115 is made in the processing of step S208 and subsequent steps shown in FIG. 4.

Then, as shown in step S208 of FIG. 4, the difference between the approximate response surface function and the dimension measured in step S207 is calculated for each circuit pattern. The sum total is calculated for the calculated difference for each circuit pattern.

Namely, the calculation of the exposure amount U(1) and the focus distance V(1) set when making the second product wafer 115 is performed from the initial exposure amount U(0) and the initial focus distance V(0) set in the exposure unit 110 when making the first product wafer 115.

To simplify the description, the circuit pattern B will now be described.

Figure 11:
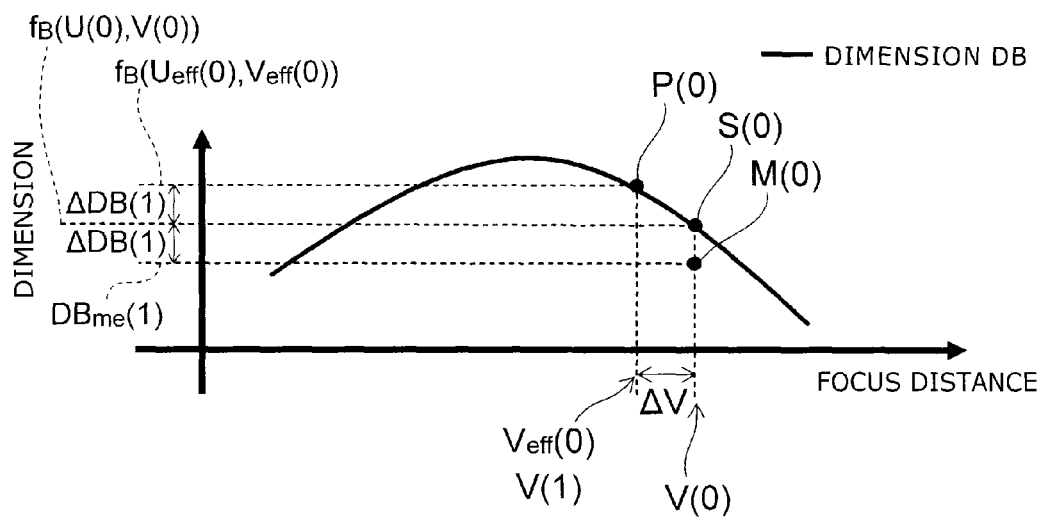
FIG. 11 is a graph showing the effects of the focus distance V on the dimension DB, where the horizontal axis is the focus distance V, and the vertical axis is the dimension DB.

FIG. 11 is a graph showing the effects of the focus distance V on the dimension DB, where the horizontal axis is the focus distance V, and the vertical axis is the dimension DB.

The dimension DB of FIG. 11 corresponds to the dimension DB shown in FIG. 10. The point M(0) shown in FIG. 11 is the point illustrating a dimension $DB_{me}(1)$ when the initial exposure amount U(0) and the initial focus distance V(0) are set in the exposure unit 110 in step S206, the product wafer 115 is manufactured, and the dimension $DB_{me}(1)$ is measured in step S207.

The point S(0) shown in FIG. 11 is the point illustrating the dimension determined from the approximate response surface function f(U, V) when the exposure amount U is U(0) and the focus distance V is V(0).

As shown in FIG. 11, the point M(0) and the point S(0) do not match; and there is a difference between the point M(0) and the point S(0). The difference is expressed by Formula 4 recited below as the difference $\Delta DB(1)$ between the dimension $f_B(U(0), V(0))$ determined from the approximate response surface function and the dimension $DB_{me}(1)$ that is measured. The difference $\Delta DB(1)$ is shown in FIG. 11 as well. For the initial focus distance V(0), the measured dimension $DB_{me}(1)$ is less than the dimension $f_B(U(0), V(0))$ determined from the approximate response surface function by the amount of the difference $\Delta DB(1)$.

$$\Delta DB(1)=f_B(U(0),V(0))-DB_{me}(1) \quad \text{[Formula 4]}$$

Then, in step S208, a sum total $\Delta D_{total}$ of the differences for all of the circuit patterns is calculated. Because the circuit pattern B is being described, the sum total $\Delta D_{total}$ of the differences is the difference $\Delta DB(1)$ and is expressed by Formula 5 recited below.

$$\Delta D_{total}=\Delta DB(1) \quad \text{[Formula 5]}$$

Then, as shown in step S209 of FIG. 4, the exposure amount U and the focus distance V are calculated so that the difference between the approximate response surface function $f_B(U, V)$ and a sum total $\Delta DB_{total}$ of the differences is a minimum. Namely, the exposure amount U and the focus distance V that satisfy Formula 6 recited below are calculated; and the exposure amount U that is calculated is used as the effective exposure amount $U_{eff}(0)$. Also, the focus distance V that is calculated is used as the effective focus distance $V_{eff}(0)$.

As shown in FIG. 11, the dimension $DB_{me}(1)$ illustrated by the point M(0) is less than the dimension $f_B(U(0), V(0))$ illustrated by the point S(0) by the amount of the difference $\Delta DB(1)$. Accordingly, to satisfy Formula 6 recited below, it is sufficient to set f(U, V) to the point P(0) which is a value that is greater than $f_B(U(0), V(0))$ by the amount of the difference $\Delta DB(1)$. Then, it is sufficient for the exposure amount U at this time to be used as the effective exposure amount $U_{\it eff}(0)$ and for the focus distance V at this time to be used as the effective focus distance $V_{\it eff}(0)$.

$$\min\{f_B(U,V)-\{f_B(U(0),V(0))-DB_{me}(1)\}\}$$ [Formula 6]

Then, as shown in step S210 of FIG. 4, an exposure amount correction value ΔU which is the difference between the effective exposure amount $U_{\it eff}(0)$ and the exposure amount U(0) set in step S206 is calculated. The exposure amount correction value ΔU is expressed by Formula 7 recited below. Also, a focus correction value ΔV which is the difference between the effective focus distance $V_{\it eff}(0)$ and the focus distance V(0) set in step S206 is calculated. The focus correction value ΔV is expressed by Formula 8 recited below. ΔV is shown in FIG. 11.

$$U(0)-U_{\it eff}(0)=\Delta U$$ [Formula 7]

$$V(0)-V_{\it eff}(0)=\Delta V$$ [Formula 8]

Then, as shown in step S211 of FIG. 4, the exposure amount U(1) and the focus distance V(1) of the next product wafer 115 are calculated. The exposure amount U(1) of the next product wafer 115 is determined by adding the exposure amount correction value ΔU to the previous exposure amount U(0) and is expressed by Formula 9 recited below. In other words, the exposure amount U(1) of the next product wafer 115 is the effective exposure amount $U_{\it eff}(0)$ calculated in the step 210. Also, the focus distance V(1) of the next product wafer 115 is expressed by Formula 9 recited below. The focus distance V(1) is the effective focus distance $V_{\it eff}(0)$. FIG. 11 shows the focus distance V(1).

$$U(1)=U(0)+\Delta U=U_{\it eff}$$ [Formula 9]

$$V(1)=V(0)+\Delta V=V_{\it eff}$$ [Formula 10]

Then, as shown in step S212 of FIG. 4, the exposure amount U(1) and the focus distance V(1) of the second product wafer 115 are set in the exposure unit 110 by modifying the exposure amount U(0) and the focus distance V(0) set in the exposure unit 110 when manufacturing the first product wafer 115.

Thereafter, in step S212 of FIG. 4, the exposure amount U(N−1) and the focus distance V(N−1) when making the Nth product wafer 115 are set in the exposure unit 110. Subsequently, in step S206, the Nth product wafer 115 is made. Subsequently, step S207 to step S210 are executed. Subsequently, in step S211, the exposure amount U(N) and the focus distance V(N) that are set when making the (N+1)th product wafer 115 are calculated. Subsequently, again in step S212, the exposure amount U(N) and the focus distance V(N) when making the (N+1)th product wafer 115 are set in the exposure unit 110. The operation of executing step S212 and the operation of again executing the step 212 are repeated. N is a natural number not less than 2.

In the embodiment, the difference between the effective focus distance $V_{\it eff}(0)$ and the focus distance V(0) set in step S206 is used as the focus correction value ΔV. This is not limited thereto. When making the multiple product wafers 115, the multiple focus correction values ΔV are calculated by multiply repeating step S208, step S209, and step S210. The average of the multiple focus correction values may be used as the focus correction value ΔV. Also, a weighted average of the multiple focus correction values may be used as the focus correction value ΔV.

The effects of the wafer lithography equipment according to the embodiment will now be described.

For example, when manufacturing the product wafer 115 of step S206 shown in FIG. 4, there are cases where dirt adheres to the bottom of the product wafer 115, and the focus distance V shifts. Also, there are cases where the exposure amount U changes due to heat, etc., dissipated from the illumination 42 of the exposure unit 110. Thereby, the dimension DA, the dimension DB, and the dimension DC that are measured change each time the product wafer 115 is made; and the product yield decreases.

Therefore, in the wafer lithography equipment 100 according to the embodiment, the desired dimension is obtained by utilizing the approximate response surface function to express the effects of the exposure amount U and the focus distance V on the dimension. In other words, the exposure amount U and the focus distance V are determined from the approximate response surface function so that the difference between the dimension that is measured and the dimension of the approximate response surface function is a minimum. The exposure amount U and the focus distance V that are determined are set in the exposure unit 110 as the next exposure amount U and focus distance V.

Thereby, for example, in the case where dirt adheres to the bottom of the product wafer 115 and the dimension changes, the exposure amount U and the focus distance V can be set in the exposure unit 110 when making the next product wafer to obtain the desired dimension.

As a result, wafer lithography equipment having increased product yield can be provided.

For the selection of the circuit pattern of step S201 of the embodiment, an example of the selection of different circuit patterns is described. This is not limited thereto. Patterns that have different periods of the same circuit pattern may be selected. The selection of three patterns of the same circuit pattern having different periods will now be described.

Figure 12:
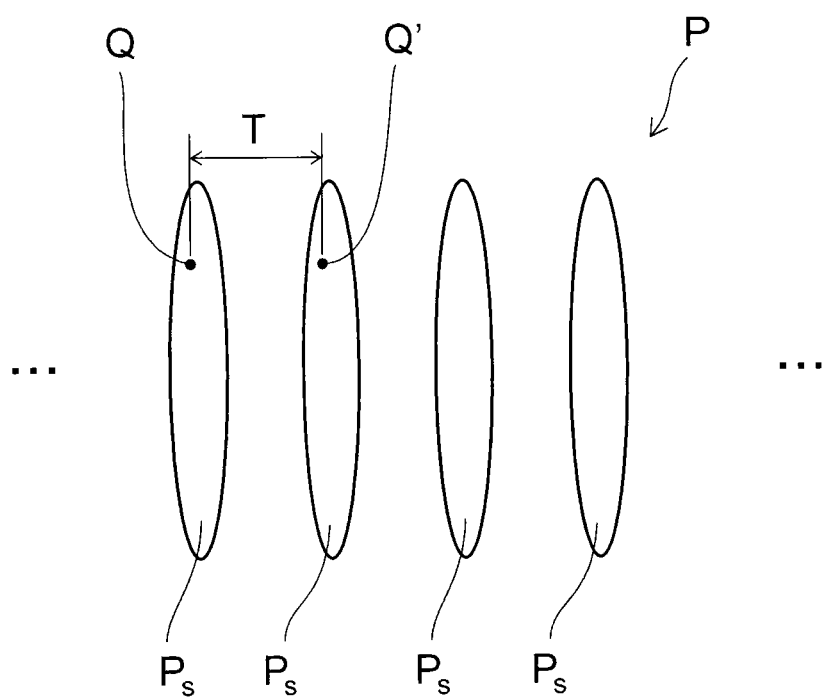
FIG. 12 is a plan view showing the circuit pattern P.

FIG. 12 is a plan view showing the circuit pattern P.

As shown in FIG. 12, multiple circuit patterns $P_s$ having the same configuration are included inside one circuit pattern P. A period T of the circuit pattern P is the distance between any point Q on the circuit pattern $P_s$ and a point Q' corresponding to the point Q on the most proximal adjacent circuit pattern $P_s$. For example, the circuit pattern $P_s$ may be a rectangle, a straight line, a circle, or another configuration.

To simplify the description, the case of the circuit pattern B will now be described.

Figure 13A:
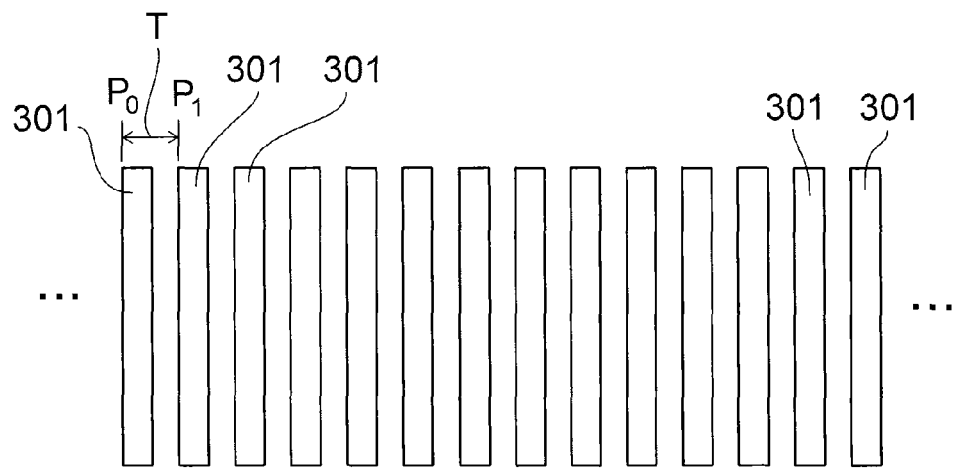
FIG. 13A is a plan view showing a circuit pattern B1.
Figure 13B:
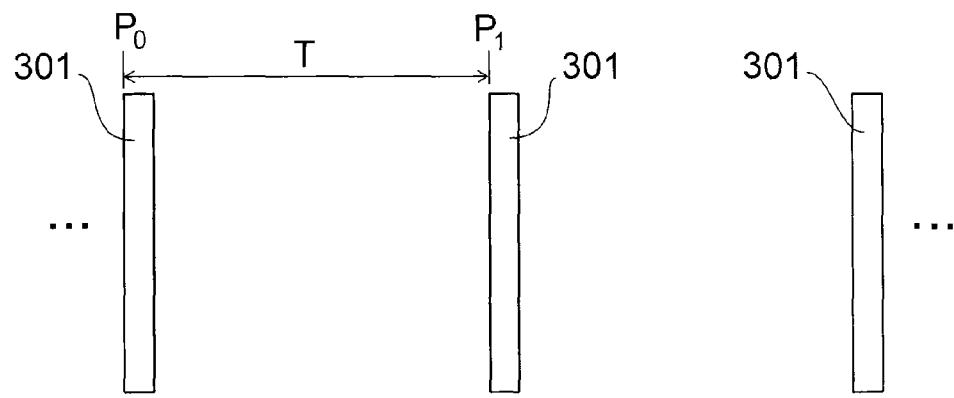
FIG. 13B is a plan view showing a circuit pattern B2.
Figure 13C:
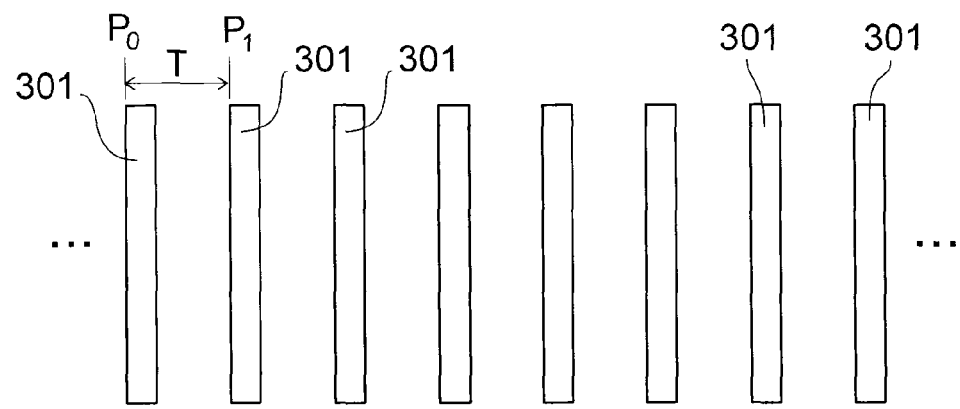
FIG. 13C is a plan view showing a circuit pattern B3.

FIG. 13A is a plan view showing a circuit pattern B1.
FIG. 13B is a plan view showing a circuit pattern B2.
FIG. 13C is a plan view showing a circuit pattern B3.

The circuit pattern B1, the circuit pattern B2, and the circuit pattern B3 are circuit patterns selected from inside the circuit pattern B inside the circuit layout. As shown in FIG. 13A, FIG. 13B, and FIG. 13C, the circuit pattern B1, the circuit pattern B2, and the circuit pattern B3 are patterns in which multiple rectangular lines 301 are arranged periodically. For the circuit patterns B1, B2, and B3, the period T is the distance between a left side $P_0$ of the line 301 and a left side $P_1$ of the most proximal adjacent line 301.

For example, the selection of the circuit pattern of step S201 may be performed by selecting from inside the circuit pattern B as shown in (iii-1) to (iii-3) recited below.

(iii-1) The circuit pattern B1 (referring to FIG. 12A) which has the minimum period T is selected from inside the circuit pattern B.

(iii-2) The circuit pattern B2 (referring to FIG. 12B) which has the maximum period T is selected from inside the circuit pattern B.

(iii-3) The circuit pattern B3 (referring to FIG. 12C) for which the period T is a period near the average of the maximum period and the minimum period is selected from inside the circuit pattern B.

According to the embodiment described above, wafer lithography equipment having increased product yield can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. Wafer lithography equipment, comprising:
an exposure unit transferring circuit patterns onto a wafer;
a measurement unit measuring dimensions of the circuit patterns transferred onto the wafer; and
a calculator, the calculator configured to
calculate a first difference, the first difference being the difference between a first dimension and a second dimension, the first dimension being obtained by substituting a first exposure amount and a first focus distance into an approximate response surface function, the second dimension being measured by the measurement unit,
calculate a second difference, the second difference being the sum total of the first difference for all of the circuit patterns,
calculate second exposure amount and a second focus distance causing a difference between the approximate response surface function and the second difference to be a minimum,
calculate a correction exposure amount, the correction exposure amount being a difference between the first exposure amount and the second exposure amount,
calculate a correction focus distance, the correction focus distance being a difference between the first focus distance and the second focus distance,
calculate a third exposure amount by adding the correction exposure amount to the first exposure amount, and
calculate a third focus distance by adding the correction focus distance to the first focus distance.

2. The wafer lithography equipment according to claim 1, wherein the approximate response surface function is calculated from a third dimension measured by the measurement unit in the case where each of an exposure amount and a focus distance are changed.

3. The wafer lithography equipment according to claim 1, including three or more of the circuit patterns.

4. The wafer lithography equipment according to claim 1, wherein
a plurality of the circuit patterns is selected from inside a circuit layout, the selected plurality of circuit patterns including
a first circuit pattern, a period of the first circuit pattern being a maximum,
a second circuit pattern, a period of the second circuit pattern being a minimum, and
a third circuit pattern, a period of the third circuit pattern being shorter than the period of the first circuit pattern and longer than the period of the second circuit pattern.

5. The wafer lithography equipment according to claim 1, wherein the calculator repeats
calculating the first difference,
calculating the second difference,
calculating the second focus distance, and
calculating the correction focus distance,
multiple times,
the calculator calculates a representative value from the plurality of correction focus distances, and
the calculator calculates a fourth focus distance by adding the representative value to the first focus distance.

6. The wafer lithography equipment according to claim 5, wherein the representative value is an average of the plurality of correction focus distances.

7. The wafer lithography equipment according to claim 5, wherein the representative value is a weighted average of the plurality of correction focus distances.

8. A method for manufacturing a semiconductor device, comprising:
transferring circuit patterns onto a wafer;
measuring dimensions of the circuit patterns transferred onto the wafer;
calculating a first dimension by substituting a first exposure amount and a first focus distance into an approximate response surface function;
calculating a first difference, the first difference being the difference between the first dimension and a second dimension, the second dimension being the measured dimension;
calculating a second difference, the second difference being the sum total of the first difference for all of the circuit patterns;
calculating a second exposure amount and a second focus distance causing a difference between the approximate response surface function and the second difference to be a minimum;
calculating a correction exposure amount, the correction exposure amount being a difference between the first exposure amount and the second exposure amount;
calculating a correction focus distance, the correction focus distance being a difference between the first focus distance and the second focus distance;
calculating a third exposure amount by adding the correction exposure amount to the first exposure amount; and
calculating a third focus distance by adding the correction focus distance to the first focus distance.

9. A non-transient computer readable medium containing an exposure correction program that, when executed, causes a computer to:
calculate a first dimension by substituting a first exposure amount and a first focus distance into an approximate response surface function;
calculate a first difference, the first difference being the difference between the first dimension and a second dimension, the second dimension being a dimension of a circuit pattern transferred onto a wafer and measured;
calculate a second difference, the second difference being the sum total of the first difference for all of the circuit patterns;
calculate a second exposure amount and a second focus distance causing a difference between the approximate response surface function and the second difference to be a minimum;
calculate a correction exposure amount, the correction exposure amount being a difference between the first exposure amount and the second exposure amount;

calculate a correction focus distance, the correction focus distance being a difference between the first focus distance and the second focus distance;
calculate a third exposure amount by adding the correction exposure amount to the first exposure amount; and
calculate a third focus distance by adding the correction focus distance to the first focus distance.

\* \* \* \* \*